United States Patent [19]

Houmoto et al.

[11] Patent Number: 5,796,689
[45] Date of Patent: Aug. 18, 1998

[54] SIGNAL PROCESSING DEVICE FOR OPTICAL PICK-UP AND A SEMICONDUCTOR DEVICE FOR THE OPTICAL PICK-UP

[75] Inventors: Tatsuya Houmoto; Fumihide Murao, both of Tokyo, Japan

[73] Assignees: Mitsubishi Denki Kabushiki Kaisha; Mitsubishi Electric Engineering Co., Ltd., both of Tokyo, Japan

[21] Appl. No.: 770,641

[22] Filed: Dec. 19, 1996

[30] Foreign Application Priority Data

May 10, 1996 [JP] Japan ................... 8-116618

[51] Int. Cl.⁶ .................................................. G11B 7/00
[52] U.S. Cl. ...................................................... 369/44.41
[58] Field of Search ............................. 369/112, 44.41, 369/102, 44.42, 124, 120

[56] References Cited

U.S. PATENT DOCUMENTS 5,229,984   7/1993   Konno et al. ................ 369/44.41
5,426,626   6/1995   Katayama ..................... 369/44.41
5,499,230   3/1996   Yanagi ......................... 369/44.41
5,550,797   8/1996   Kimura et al. ................ 369/44.41

*Primary Examiner*—Nabil Hindi
*Attorney, Agent, or Firm*—Leydig, Voit & Mayer, Ltd.

[57] ABSTRACT

A signal processing device for optical pick-up includes an information signal silicon photo diode (SPD) group having a plurality of silicon photo diodes. A first electrode of each of the respective silicon photo diodes is connected to a common connection node. A second electrode of each of the respective silicon photo diodes is connected to a corresponding electric potential. An information signal amplifier includes an input node connected to the common connection point and an output node for outputting an information signal. A focus signal SPD group includes a plurality of silicon photo diodes. First electrodes of each of the respective silicon photo diodes of the focus signal SPD group are connected in common and further are connected to the input node of the information signal amplifier.

12 Claims, 14 Drawing Sheets

SIGNAL PROCESSING DEVICE FOR OPTICAL PICK-UP AND A SEMICONDUCTOR DEVICE FOR THE OPTICAL PICK-UP

BACKGROUND OF THE INVENTION

1. Field of the Invention

The invention relates to an optical pick-up system for detecting information signal having less noise, by directly adding all photo-electric currents generated in a plurality of silicon photo diodes (hereinafter, SPD) where laser light is irradiated.

2. Description of the Prior Art

FIG. 12 is a schematic diagram showing an optical pick-up system in an optical disk apparatus. In FIG. 12, four SPD elements 70 are used for light detection, which are comprised in a light detection apparatus 100. Laser light 110 is irradiated on an optical disk 120 which memorizes information, and the incident laser light 110 is reflected from optical disk 120 as a laser reflection light 130. In FIG. 12, when the laser light 110 is irradiated on the optical disk 120, the reflected laser light 130 has different values according to the information patterns memorized on the optical disk 120, the reflected laser light 130 then is irradiated on the SPD elements 70 on the light detection apparatus 100. The SPD elements 70, as usually illustrated, have four divided sections A, B, C, and D. The laser reflection light 130 is focused to be equally irradiated on the center portion of all of these sections A, B, C, and D. The SPD elements 70 detect the intensity of the light, for example, of the laser reflection light 130, and then convert the information value to a voltage so that it is outputted as an information signal or a focus signal.

FIG. 13 is a diagram showing an example of a conventional optical pick-up system. In FIG. 13, the optical pick-up circuit comprises a light signal detection amplifier (hereinafter, RF amplifier) 10, an I–V conversion focus amplifier (hereinafter, focus amplifier) 20, a reference voltage $V_{ref1}$ 50 which is connected to a non-inverting input terminal of the RF amplifier 10, a reference voltage $V_{ref2}$ 60 which is connected to a non-inverting input terminal of the focus amplifier 20, and a silicon photo diode (SPD) 70 including the SPD elements (A, B, C, and D). The RF amplifier 10 consists of an operational amplifier (information signal amplifier) 11 and a feedback resistor r11. The feedback resistor r11 in the RF amplifier 10 is fed back from the output terminal of the operational amplifier 11 to the inverting input terminal thereof. The output of the RF amplifier 10 is outputted as an information signal $RF_{OUT}$ from a terminal 16. The focus amplifier 20 consists of operational amplifiers 21~24 and feedback resistors r21~r24. The feedback resistors r21~r24 in the focus amplifier 20 are connected between the output terminals and the inverting input terminals in the respective operational amplifiers 21~24. The respective outputs from the focus amplifier 20 are outputted as focus signals $A_{OUT}$~$D_{OUT}$ from the respective terminals 26~29. A cathode electrode of each respective SPD in the SPD elements 70 is connected to the corresponding inverting input terminal of an operational amplifier in the focus amplifier 20 and a respective anode electrode is connected to a ground.

FIG. 14 is a diagram showing a structure of conventional SPD elements (A, B, C and D) 70 which are formed on a semiconductor substrate. The SPD elements (A, B, C, and D) 70 are formed between a P type substrate of the semiconductor and an N type epitaxial layer 34 formed thereon. Each respective N type epitaxial layer 34 is separated by isolation regions 33 at both sides thereof. The diode mark illustrated in FIG. 14 means that the diodes (SPD) are formed between the P type substrate and the N type epitaxial layer defined thereon, an anode of the diode is on the P type substrate side and a cathode of the diode is on the N type epitaxial layer side. This structure is manufactured by using well-known technique, and therefore further explanation is omitted here.

The operation of the conventional optical pick-up system is explained below. As shown in FIG. 12, four SPDs are arranged at the light receiving portion to detect focus signal or information signal. These four SPDs receive laser reflection light 130 and generate photo-electric current. As shown in FIG. 13, the respective photo-electric currents I flow in the feedback resistors r21~r24. The feedback resistors r21~r24 convert the current to voltage in the respective resistors r21~r24. Respective focus voltage signals are outputted from the output terminals of the respective focus amplifiers 20.

This focus signal is used for controlling the focal point so that the laser reflection light 130 is irradiated to the center of SPD elements 70. This is not directly relevant to the present invention, so further explanation is omitted here. Each respective voltage signal of this focus signal is added via a resistor 80 and then inputted to the RF amplifier 10. The voltage signal which is inputted to the RF amplifier 10 is amplified and then outputted from the output terminal of the RF amplifier 10. The detection of the information signal is carried out by the voltage signal outputted from this RF amplifier 10.

Since the conventional optical pick-up system has a construction as mentioned above, the focal point (a focus) of laser reflection light should be adjusted so that the laser reflection light 130 is converged to an accurate position for detecting the information signal. In order to focus the laser reflection light, it is necessary to get signals from the respective SPD. In the prior art, the signal is detected from respective SPD for the focusing purpose and then the same signal is used for detecting an information signal.

In the optical pick-up system, the light emitted from a semiconductor laser is irradiated on the disk, and then reflected from the surface of the disk and then the reflected light is radiated on the SPD elements 70. In an optical disk system such as DVD, since the information density of the disk becomes high, respective bit region becomes smaller, that is, the reflection factor also becomes smaller. The light inputted to the SPD elements 70 in DVD, in other words the Rf level of the optical pick-up, also becomes smaller, compared with CD-ROM. Accordingly, in the conventional optical pick-up system, since the voltage signals from the focus amplifiers 20 are added and amplified, S/N ratio at the output of the RF amplifier 10 deteriorates because noises generated in the focus amplifier 20 are added simultaneously and then amplified. This makes it difficult to detect the information signal. Since the noise depends most on the resistive value of feedback resistors r21~r24 in the focus amplifier 20, the incidence of the noise increases as the resistive value becomes higher.

Furthermore, the noise deteriorates the jitter value and makes the reading of signals more difficult.

SUMMARY OF THE INVENTION

An object of the invention is to provide an optical pick-up system for eliminating the noise which would be generated in the focus amplifier.

SUMMARY OF THE INVENTION

According to one aspect of the invention, a signal processing device for optical pick-up comprises an information signal SPD group comprising a plurality of silicon photo diodes, whose one electrode of the respective silicon photo diodes is connected in common, and other electrode of the respective silicon photo diodes is connected to a predetermined electric potential point. The device further comprises an information signal amplifier whose input node is connected to the common connection point where one electrode of the respective silicon photo diodes in the information signal SPD group is connected to, and for outputting an information signal from its output node.

According to another aspect of the invention, a signal processing device for optical pick-up further comprises a focus signal SPD group comprising a plurality of silicon photo diodes, each electrode of the respective silicon photo diodes is connected in common and further is connected to the input node of the information signal amplifier. The device further comprises focus signal amplifiers which correspond to the plurality of silicon photo diodes in the focus signal SPD group, respectively, each input node of the focus signal amplifiers is connected to respective other electrode of the corresponding silicon photo diodes, and for outputting a focus signal from its output node.

According to further aspect of the invention, a signal processing device for optical pick-up comprises an information signal SPD group comprising a plurality of silicon photo diodes, one electrode of the respective silicon photo diodes is connected in common, and other electrode of the respective silicon photo diodes is connected to a predetermined electric potential point. The device further comprises an information signal amplifier comprising an operational amplifier whose inverted input terminal is connected to an input node which is connected to a common connection point where one electrode of the respective silicon photo diodes in the information signal SPD group is connected to, whose non-inverted input terminal is connected to a first referential electric potential, and its output terminal is connected to an output node for outputting an information signal, and further comprising a resistor element connected between the inverted input terminal and the output terminal of the operational amplifier. The device further comprises a focus signal SPD group comprising a plurality of silicon photo diodes, each electrode of the respective silicon photo diodes is connected in common and further is connected to the input node of the information signal amplifier. The device further comprises focus signal amplifiers which correspond to the plurality of silicon photo diodes in the focus signal SPD group, respectively, whose inverted input terminal of the operational amplifier is connected to an input node which is connected to other electrode of the corresponding silicon photo diode, whose non-inverted input terminal is connected to a second referential electric potential, and its output terminal is connected to a corresponding output node for outputting a focus signal, and further comprising a plurality of resistor elements each of which corresponds to the respective plurality of operational amplifiers and is connected between the non-inverted input terminal and the output terminal of the corresponding operational amplifier.

According to further aspect of the invention, a semiconductor device for an optical pick-up comprises an information signal SPD group comprising four silicon photo diodes wherein one electrode of the respective silicon photo diodes is connected in common and further the one electrode is connected to an input node of an information signal amplifier, and other electrode of the respective silicon photo diodes is connected to a predetermined electric potential. The device further comprises a focus signal SPD group comprising four silicon photo diodes wherein one electrode of the respective silicon photo diodes is connected in common and further is connected to the input node of the information signal amplifier, and other electrode of the respective silicon photo diodes is connected to a corresponding input node of a focus signal amplifier; wherein a semiconductor body comprising a first-conductive-type semiconductor substrate, a second-conductive-type epitaxial layer which defines a PN junction on the first-conductive-type semiconductor substrate, and four SPD formation regions each of which comprises the silicon photo diodes in the information signal SPD group and the silicon photo diodes in the focus signal SPD group, each of the four SPD formation regions is separated closely from each other by a first-conductive-type separation region extended from a surface of the epitaxial layer to a surface of the semiconductor substrate, wherein the semiconductor substrate provides a region for one electrode of the respective silicon photo diodes in the information signal SPD group, the epitaxial layer surrounded by the separation region provides a region for other electrode of the respective silicon photo diodes in the information signal SPD group as well as a region for one electrode of the respective silicon photo diodes in the focus signal SPD group; and four first-conductive-type first semiconductor regions formed on the epitaxial layer which is surrounded by the separation region in the respective SPD formation regions, for providing regions for other electrode of the respective silicon photo diodes in the focus signal SPD group.

According to still further aspect of the invention, a semiconductor device for an optical pick-up comprises an information signal SPD group, which consists of first and second silicon photo diodes connected in parallel, the information signal SPD group comprises four silicon photo diodes wherein one electrode of the respective silicon photo diodes is connected in common and further the one electrode is connected to an input node of an information signal amplifier, and other electrode of the respective silicon photo diodes is connected to a predetermined electric potential. The device further comprises a focus signal SPD group comprising four silicon photo diodes wherein one electrode of the respective silicon photo diodes is connected to an input node of a corresponding focus signal amplifier, and other electrode of the respective silicon photo diodes is connected to a predetermined electric potential. The device further comprises a semiconductor body comprising a first-conductive-type semiconductor substrate, a second-conductive-type epitaxial layer which defines a PN junction on the first-conductive-type semiconductor substrate, and four SPD formation regions each of which comprises the silicon photo diodes in the information signal SPD group and the silicon photo diodes in the focus signal SPD group, each of the four SPD formation regions is separated closely from each other by a first-conductive-type separation region extended from a surface of the epitaxial layer to a surface of the semiconductor substrate, wherein the semiconductor substrate provides a region for one electrode of the respective silicon photo diodes in the information signal SPD group. The device further comprises four second-conductive-type first embedded regions which are embedded at respective PN junctions between the semiconductor substrate body surrounded by the separation region and the epitaxial layer on the semiconductor substrate body, providing a region for other electrode of the respective first and second silicon photo diodes in the information signal SPD group. The device further comprises four first-conductive-type second embedded regions formed on the respective first embedded regions, providing a region for other electrode of the respective second silicon photo diodes of the respective silicon photo diodes in the information signal SPD group and a region for other electrode of the respective silicon photo diodes in the focus signal SPD group. The device further comprises and a first-conductive-type lead region extending from the surface of the epitaxial layers in the respective SPD formation regions surrounded by the separation region to the second embedded region, for separating the epitaxial layer in the respective SPD formation region into an inside epitaxial layer and an outside epitaxial layer, and drawing an electrode for the respective second embedded regions; wherein, the outside epitaxial layer provides a region for an electrode of the first embedded region, and the inside epitaxial layer provides a region for the one electrode of the respective silicon diodes in the focus signal SPD group.

DETAILED DESCRIPTION OF THE PREFERRED EMBODIMENTS

EMBODIMENT 1

Figure 1:
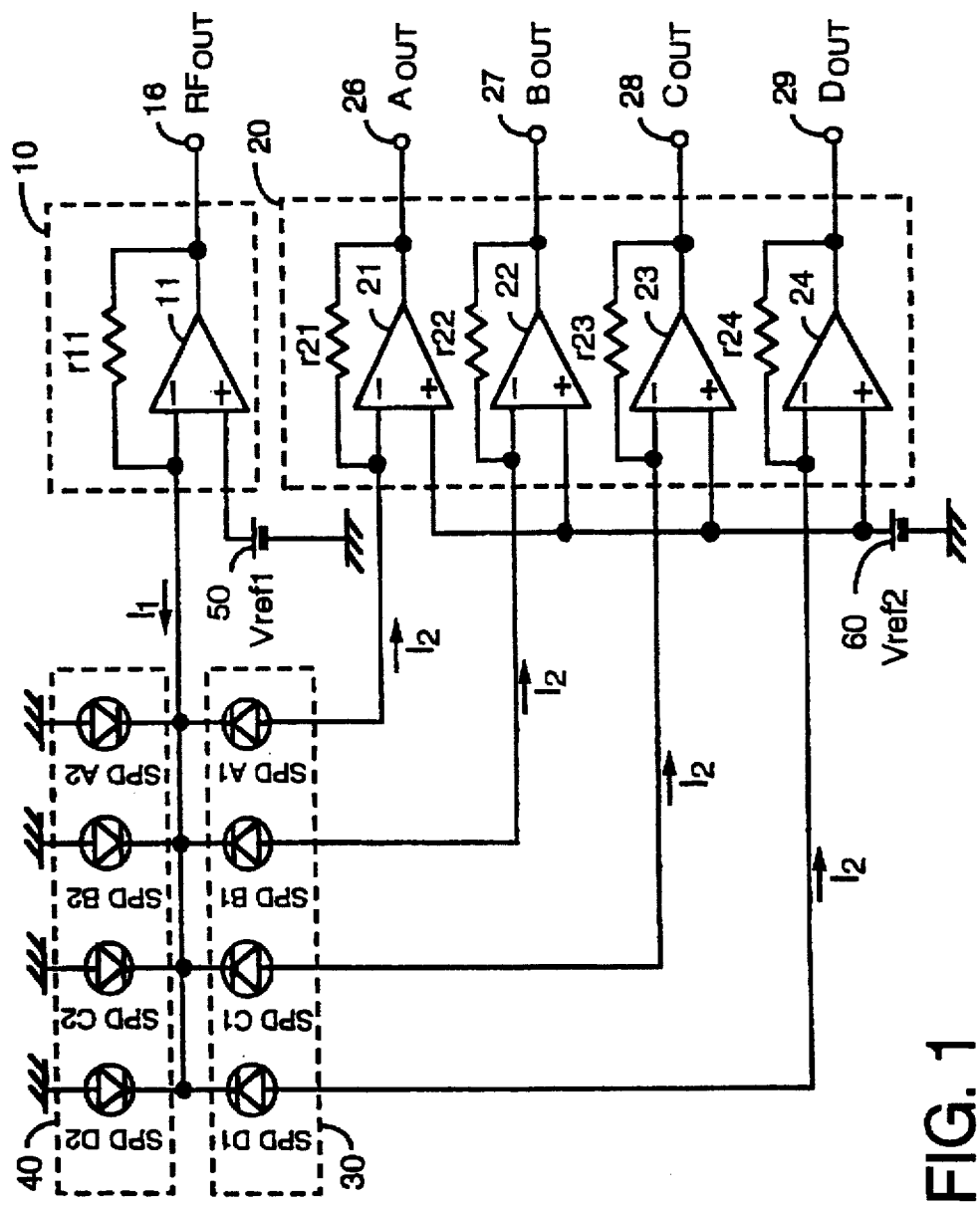
FIG. 1 is a block diagram showing an SPD in an optical pick-up system according to a first embodiment of the invention.
Figure 12:
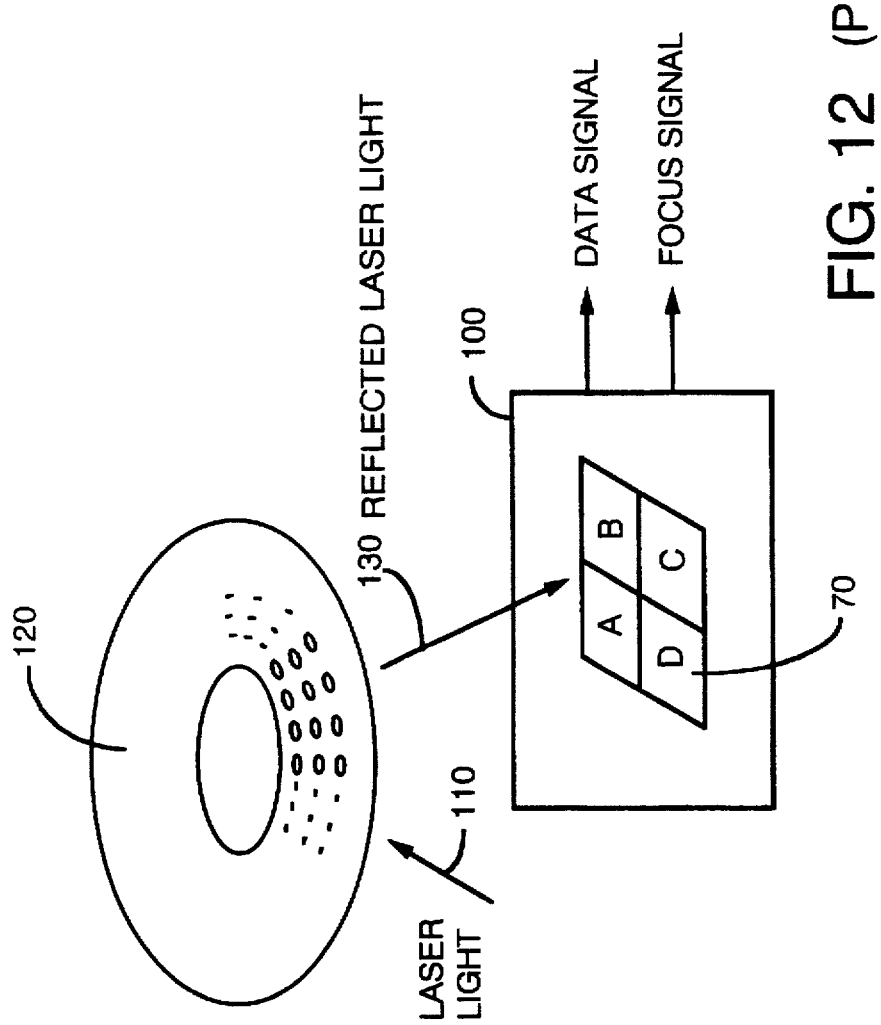
FIG. 12 is a diagram showing SPD elements in an optical pick-up system.
Figure 13:
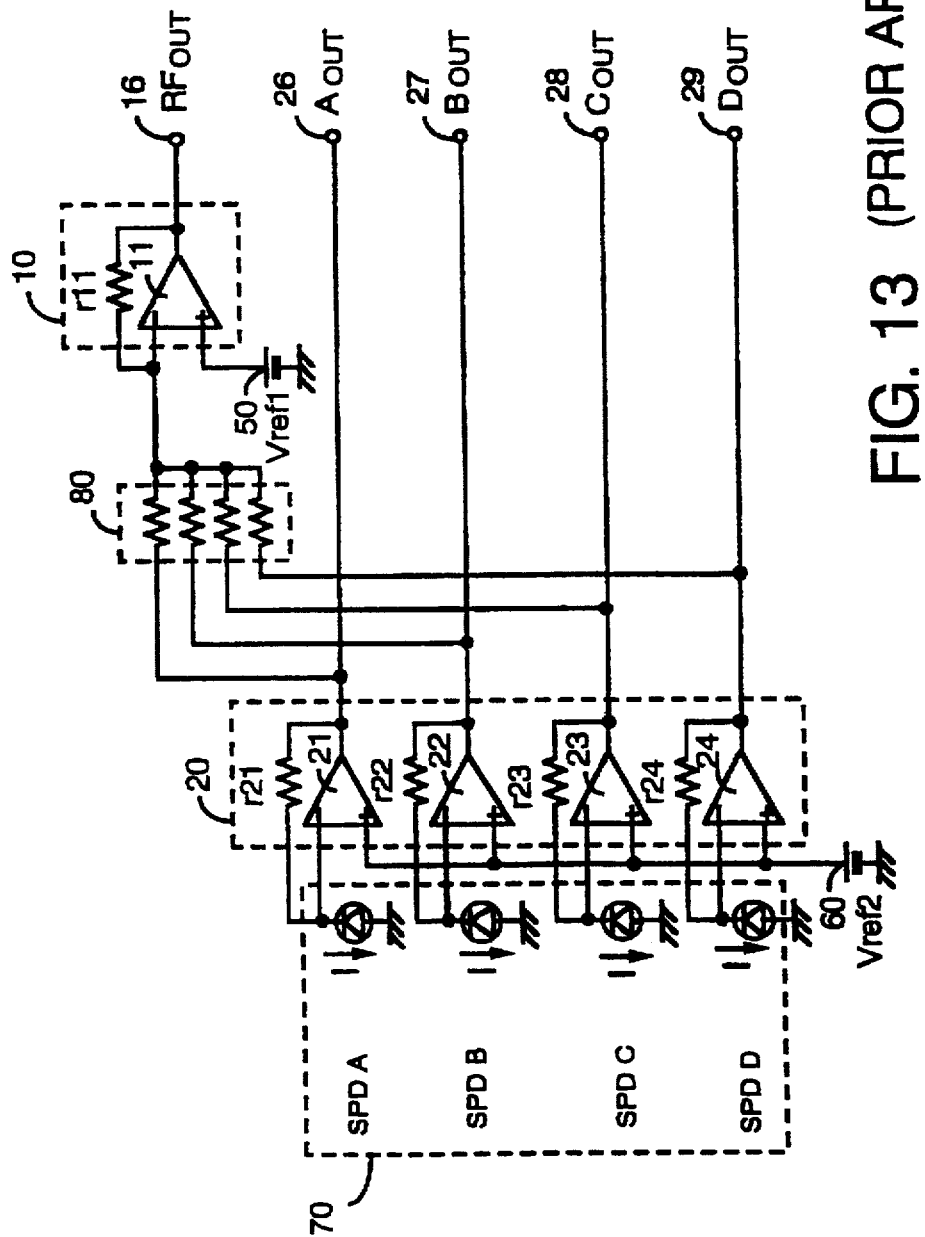
FIG. 13 is a block diagram showing a conventional SPD optical pick-up system.
Figure 14:
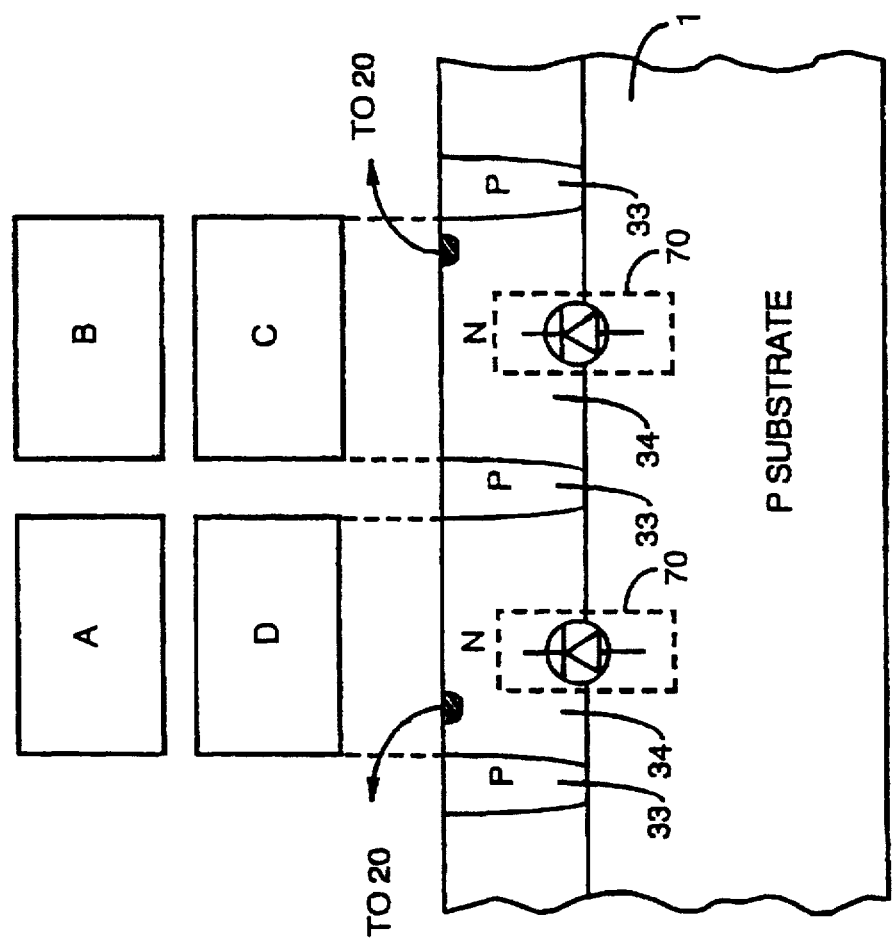
FIG. 14 is a structural diagram showing an IC of a conventional SPD.

FIG. 1 is a block diagram showing an optical pick-up system according to a first embodiment of the invention. The optical pick-up system comprises an RF amplifier 10, a focus amplifier 20, and a first SPD group 30 which comprises an SPD•A1, an SPD•B1, an SPD•C1 and an SPD•D1. In FIG. 1, the SPD•A1, the SPD•B1, the SPD•C1 and the SPD•D1 are formed in the respective portions A, B, C, and D of the silicon photo diodes pad as shown in FIG. 12. In the first SPD group 30, cathode electrode of the respective SPDs are connected to the inverting input terminal of the RF amplifier 10 and anode electrodes of respective SPDs are connected to the respective inverting input terminals of the operational amplifiers 21~24 in the focus amplifier 20. A second SPD group 40 consists of an SPD•A2, an SPD•B2, an SPD•C2 and SPD•D2. The SPD•A2, the SPD•B2, the SPD•C2 and the SPD•D2 are formed in the respective portions A, B, C, and D of the silicon photo diodes pad also as shown in FIG. 12. In the second SPD group 40, cathode electrodes of respective SPD are connected to the inverting input terminal of the RF amplifier 10 and anode electrodes of the respective SPDs are connected to a ground.

A reference voltage source 50 is connected to the non-inverting input terminal of the operational amplifier 11 in the RF amplifier 10. The reference voltage source 60 is commonly connected to the respective non-inverting input terminals of the operational amplifiers 21~24 in the focus amplifier 20. In this case, the voltage relationship of both the reference voltage source 50 and 60 is defined such as $V_{ref1} > V_{ref2}$ so that respective SPDs in the first SPD group 30 are supplied by the reverse bias. $V_{ref1}$ is a terminal voltage of the reference voltage sources 50 and $V_{ref2}$ is a terminal voltage of the reference voltage sources 60. The feedback resistors r21~r24 in the focus amplifier 20 are connected between the respective output terminals 26~29 and the inverting input terminals of the respective operational amplifiers 21~24. The output terminal of the operational amplifier 11 in the RF amplifier 10 is connected to the inverting input terminal of the operational amplifier 11 via the feed back resistor 11. The output $RF_{OUT}$ from the RF amplifier 10 is connected to an analog/digital converter in the next stage which is not illustrated in FIG. 1. The focus signals $A_{OUT}$ ~$D_{OUT}$ from the focus amplifier 20 are connected to a focus control circuit in the next stage.

Figure 5:
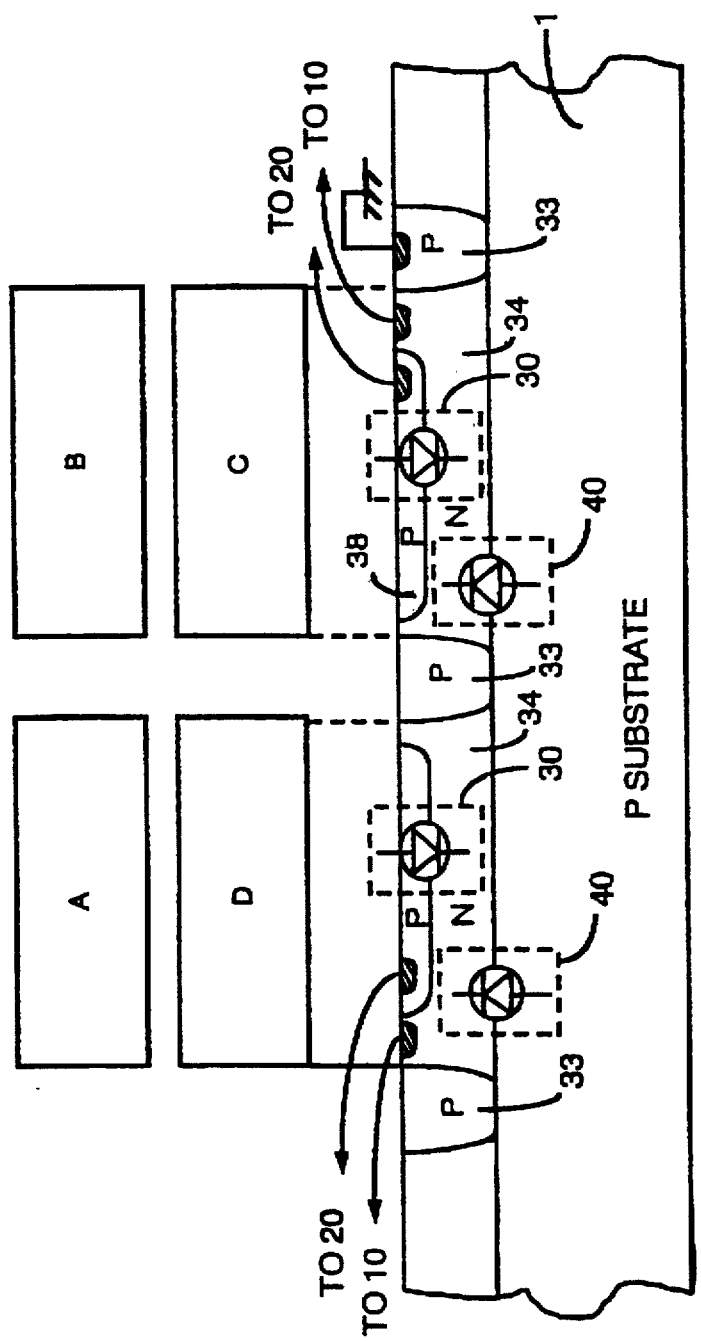
FIG. 5 is a structural diagram showing an IC of the SPD according to the first embodiment of the invention.

FIG. 5 is a cross sectional view of the SPDs in the optical pick-up system according to the first embodiment of the invention. In this optical pick-up system, the second SPD group 40 are formed between the P type substrate 1 and the respective N type regions 34 which are separated by isolation regions 33 at both sides thereof. On the other hand, the first SPD group 30 is formed between the N type region 34 on the P type substrate and the P type regions 38 on the N type region 34. In FIG. 5, the P type substrate 1 is grounded, the N type regions 34 on the P type substrate are commonly connected to the inverted input terminal of the operational amplifier 11 in the RF amplifier 10. Respective P type regions 38 at the top portion are connected to the inverted input terminals of the respective operational amplifiers 21~24 in the focus amplifier 20. The anodes of the first SPD 30 correspond to the P type regions 38 and the cathodes of the first SPD 30 correspond to the N type regions 34. On the other hand, the anodes of the diodes forming the second SPD 40 correspond to the P type substrate 1 and the cathodes of the second SPD 40 correspond to the N type regions 34.

An operation of the first embodiment is explained below. The respective four SPDs receive laser reflection light 130 and generate photo-electric current. The currents generated in the respective SPDs in the first SPD group 30 flow from the respective anode electrodes to the respective output terminals through the respective resistors r21~r24 in the focus amplifier 20. Accordingly, the respective currents cause voltage drops in the resistors r21~r24. Therefore, the voltage of focus signal $A_{OUT}$~$D_{OUT}$ at the output terminals 26~29 of the operational amplifiers 21~24 in the focus amplifier 20 is lower than $V_{ref2}$ by the voltage drop due to the respective resistors r21~r24. Using this focus signals $A_{OUT}$–$D_{OUT}$, the focal point of the laser reflection light is adjusted. On the other hand, the currents generated in the respective SPDs in the first SPD group 30 and the currents generated in the respective SPDs in the second SPD group 40 are added together, and flow from the output terminal to the respective cathode electrodes through the feedback resistor r11 in the RF amplifier 10. Therefore, the voltage of an information signal $RF_{OUT}$ at the output terminal 16 of the operational amplifier 11 in the RF amplifier 10 is higher than $V_{ref1}$ by the voltage due to the voltage drop in the feedback resistor r11. The detection of the information signal is carried out by this information signal $RF_{OUT}$.

As mentioned above, a feature of the invention lies in that photo-electric currents generated in the SPDs in both the first SPD group 30 and the second SPD group 40 are directly added for detecting the information signal, although adjusting the focal point of laser reflection light is carried out by the photo-electric currents generated in the first SPD group 30. Accordingly, even if the laser reflection light 130 is feeble, the detection of the information signal is possible. Furthermore, unlike the prior art, since the signals which are passed through the focus amplifier 20 are not used for the detection of the information signal, the noise which is generated in the focus amplifier 20 is not added to the data detection signal. Accordingly, an information signal with less error can be detected.

EMBODIMENT 2

Figure 2:
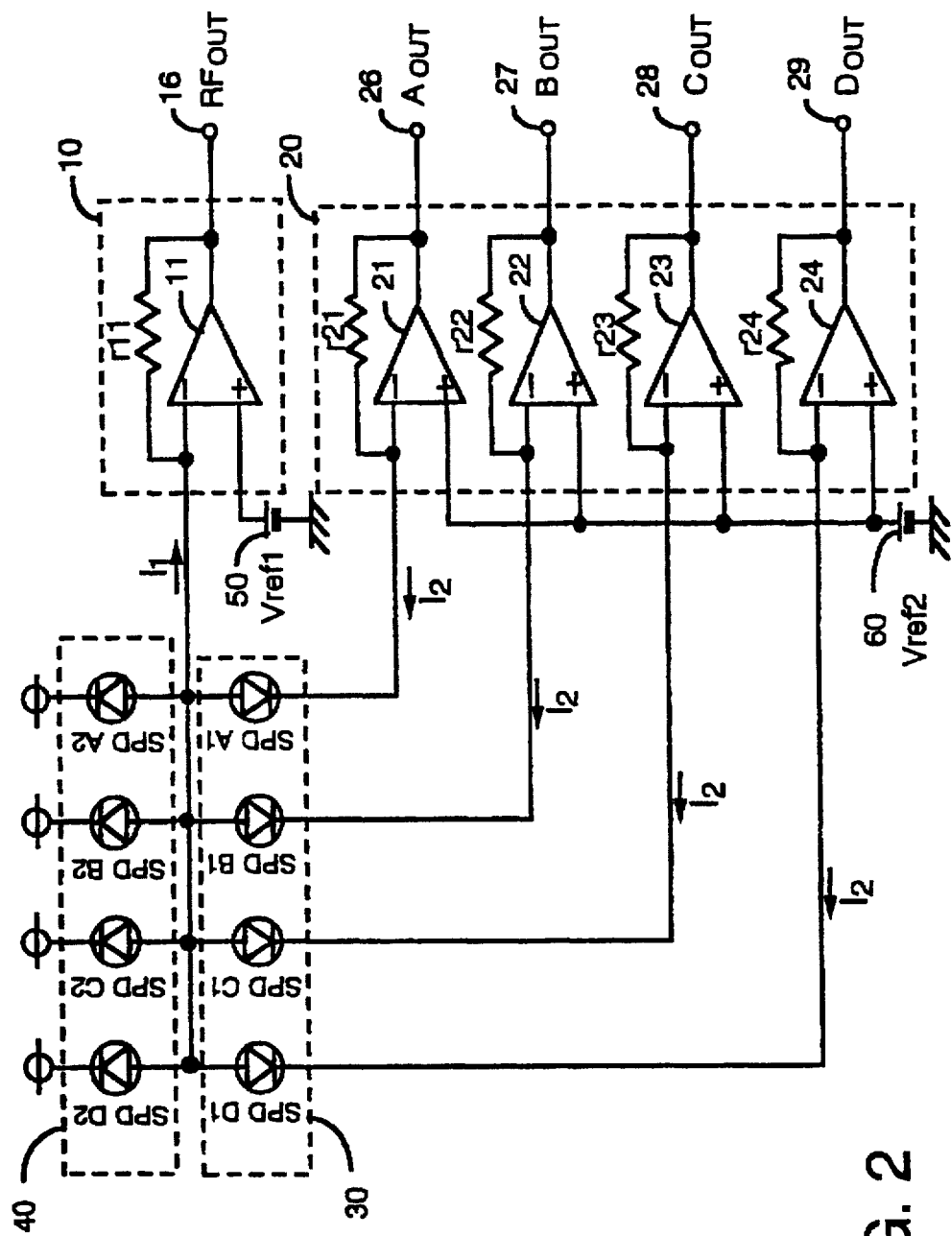
FIG. 2 is a block diagram showing an SPD in an optical pick-up system according to a second embodiment of the invention.

FIG. 2 is a block diagram showing an optical pick-up system according to a second embodiment of the invention. In this system of the second embodiment, the P type substrate of the first embodiment is replaced by an N type substrate. The optical pick-up system comprises an RF amplifier 10, a focus amplifier 20, and a first SPD group 30 which comprises an SPD•A1, an SPD•B1, an SPD•C1 and an SPD•D1. In FIG. 2, the SPD•A1, the SPD•B1, the SPD•C1 and the SPD•D1 are formed in the respective portions A, B, C and D of the silicon photo diodes pad as shown in FIG. 12. In the first SPD group 30, anode electrodes of the respective SPDs are connected to the inverting input terminal of the RF amplifier 10, and cathode electrodes of respective SPDs are connected to the respective inverting input terminals of the operational amplifiers 21~24 in the focus amplifier 20. A second SPD group 40 consists of an SPD•A2, an SPD•B2, an SPD•C2 and an SPD•D2. The SPD•A2, the SPD•B2, the SPD•C2 and the SPD•D2 are formed in the respective portions A, B, C and D of the silicon photo diodes pad also as shown in FIG. 12. In the second SPD group 40, anode electrodes of respective SPD are connected to the inverting input terminal of the RF amplifier 10 and cathode electrodes of the respective SPDs are connected to a power supply source.

A reference voltage source 50 is connected to the non-inverting input terminal of the operational amplifier 11 in the RF amplifier 10. The reference voltage source 60 is commonly connected to the respective non-inverting input terminals of the operational amplifiers 21~24 in the focus amplifier 20. In this case, the voltage relationship of both the reference voltage sources 50 and 60 is defined such as $V_{ref1} < V_{ref2}$ so that respective SPDs in the first SPD group 30 are supplied by the reverse bias. $V_{ref1}$ is a terminal voltage of the reference voltage sources 50 and $V_{ref2}$ is a terminal voltage of the reference voltage source 60. The feedback resistors r21~r24 in the focus amplifier 20 are connected between the respective output terminals 26~29 and the inverting input terminals of the respective operational amplifiers 21~24. The output terminal of the operational amplifier 11 in the RF amplifier 10 is connected to the inverting input terminal of the operational amplifier 11 via the feedback resistor r11. The output $RF_{OUT}$ from the RF amplifier 10 is connected to an analog/digital converter in the next stage which is not illustrated in FIG. 2. The focus signals $A_{OUT}$–$D_{OUT}$ from the focus amplifier 20 are connected to a focus control circuit in the next stage.

Figure 6:
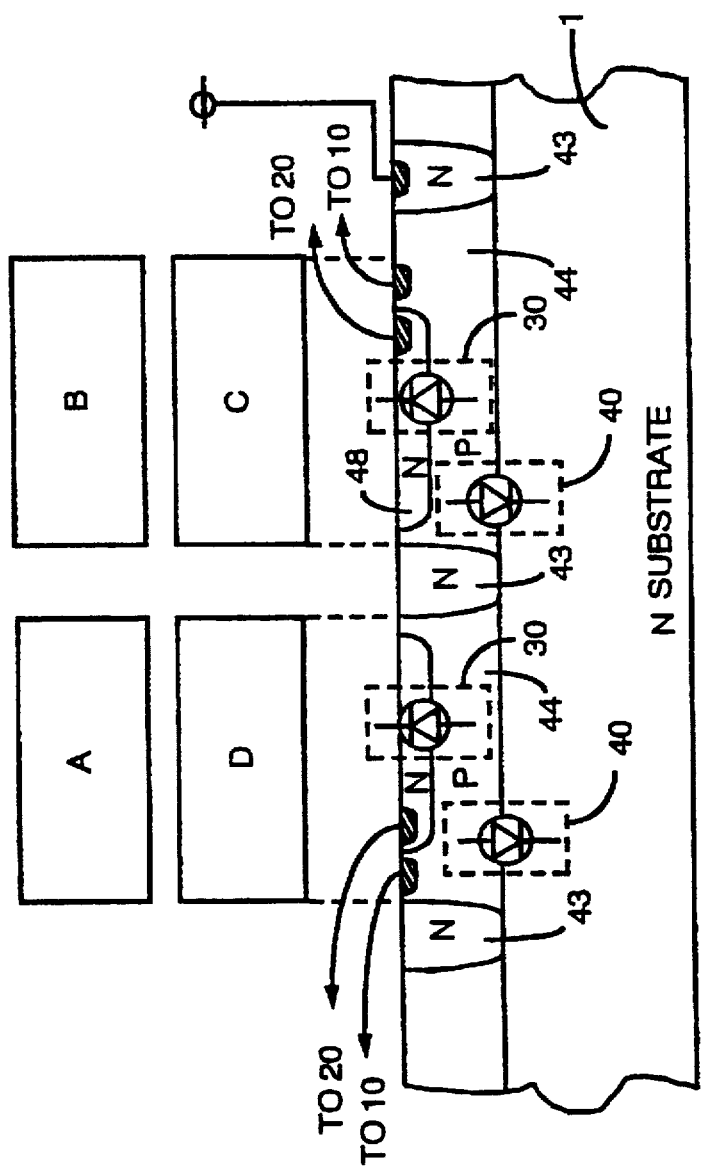
FIG. 6 is a structural diagram showing an IC of the SPD according to the second embodiment of the invention.

FIG. 6 is a cross sectional view of the SPDs in the optical pick-up system according to the second embodiment of the invention. In this optical pick-up system, the second SPD group 40 are formed between the N type substrate 1 and the respective P type regions 44 which is separated by isolation regions 43 at both sides thereof. The first SPD group 30 is formed between the P type region 44 on the N type substrate and the N type region 48 on the P type region 44. The anodes of the SPDs in the first SPD group 30 correspond to the P type region 44 and the cathodes of the SPDs in the first SPD group 30 correspond to the N type region 48. The anodes of the diodes forming the SPDs in the second SPD group 40 correspond to the P type region 44 and the cathodes of the SPDs in the second SPD group 40 correspond to the N type substrate 1. In FIG. 6, the N type substrate 1 is connected to a power supply source and the P type layer on the N type substrate is connected in common to the inverted input terminal of the operational amplifier 11 in the RF amplifier 10. An N type layer at the top portion are connected to the inverted input terminals of the respective operational amplifiers 21~24 in the focus amplifier 20.

The operation of the second embodiment is explained below. Similarly to the prior art, the four SPDs (A~D) receive laser reflection light 130 and generate respective photo-electric currents. The currents generated in the respective SPDs in the first SPD group 30 flow through the respective resistors r21~r24 in the focus amplifier 20 in the direction from the output terminals to the cathode electrodes. Therefore, the voltage of focus signals $A_{OUT}$–$D_{OUT}$ at the output terminals 26~29 of the respective operational amplifiers 21~24 in the focus amplifier 20 is higher than $V_{ref2}$ by the voltage drop due to the respective resistors r21~r24. Using the focus signals $A_{OUT}$–$D_{OUT}$, focal point of the laser reflection light is adjusted. On the other hand, the currents generated in the respective SPDs in the first SPD group 30 and the currents generated in the respective SPDs in the second SPD group 40 are added together and flow from the cathode electrodes to the output terminal through the feedback resistor r11 in the RF amplifier 10. Therefore, the voltage of an information signal $RF_{OUT}$ at the output terminal 16 of the operational amplifier 11 in the RF amplifier 10 is higher than $V_{ref1}$ by the voltage due to the voltage drop in the feedback resistor r11. The detection of the information signal is carried out by this information signal $RF_{OUT}$.

As mentioned above, the feature of the invention, similar to that of the first embodiment, lies in that photo-electric currents generated in the SPDs in both the first SPD group 30 and the second SPD group 40 are directly added for detecting information signal, although adjusting the focal point of laser reflection light is carried out by the photo-electric current generated in the first SPD group 30. Accordingly, even if the laser reflection light 130 is feeble, the detection of information signal is possible. Furthermore, unlike the prior art, since the signals which are passed through the focus amplifier 20 are not used for the detection of information signal, the noise which is generated in the focus amplifier 20 is not added to the data detection signal. Accordingly, an information signal with less error can be detected.

EMBODIMENT 3

Figure 3:
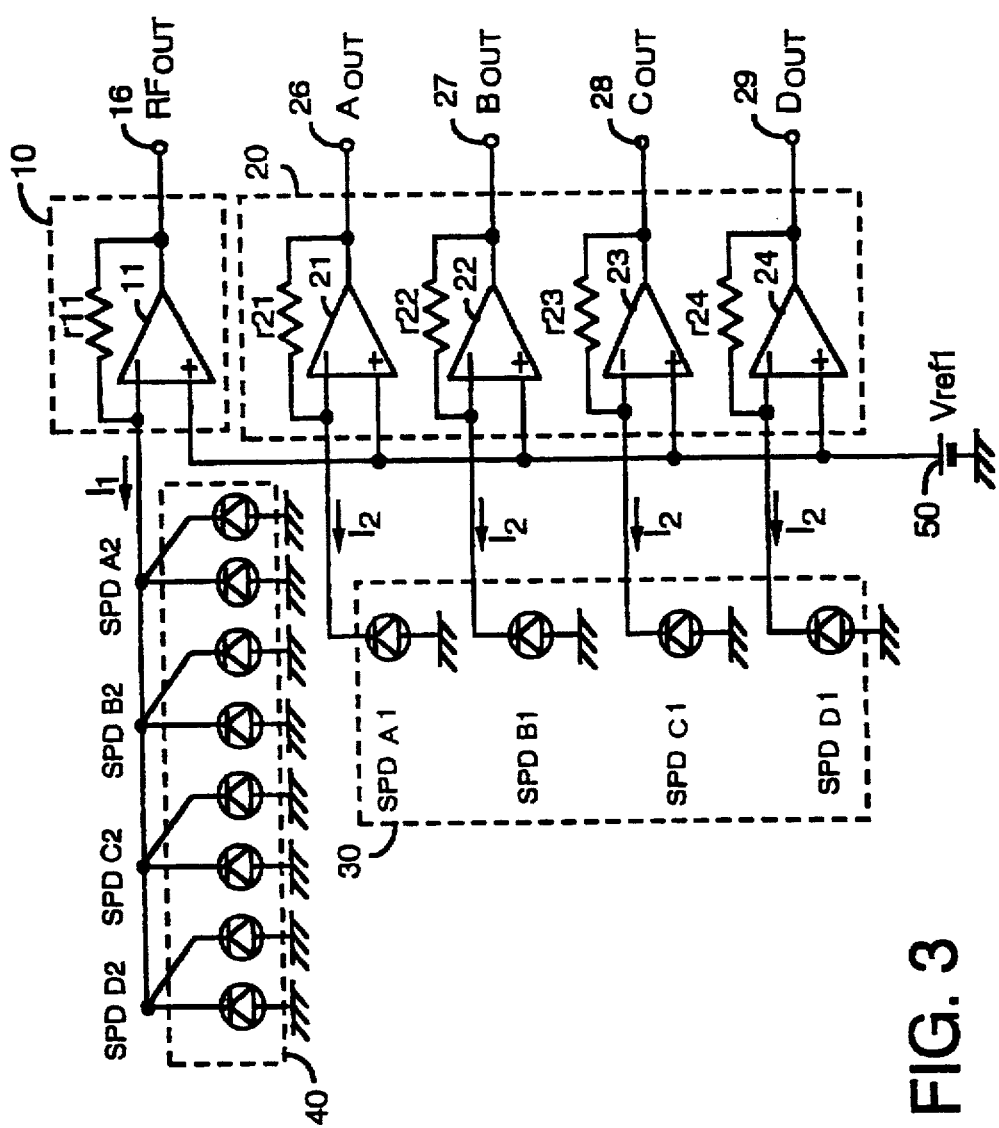
FIG. 3 is a block diagram showing an SPD in an optical pick-up system according to a third embodiment of the invention.

FIG. 3 is a block diagram showing an optical pick-up system according to a third embodiment of the invention. The system according to the third embodiment is different from those of the first and the second embodiment in that it refers to an optical pick-up system in which photo-electric currents generated in the respective separated SPDs are supplied to the respective inverting input terminals of the RF amplifier 10 as well as the focus amplifier 20.

The optical pick-up system in FIG. 3 comprises an RF amplifier 10, a focus amplifier 20 and a first SPD group 30 which comprises an SPD•A1, an SPD•B1, an SPD•C1 and an SPD•D1. In the first SPD group 30, respective cathode electrodes are connected to respective inverting input terminals of the focus amplifier 20, and respective anode electrodes are connected to the ground. A second SPD group 40 consists of an SPD•A2, an SPD•B2, an SPD•C2 and an SPD•D2. Respective SPDs, namely the SPD•A2, the SPD•B2, the SPD•C2 and the SPD•D2, consist of respective parallel circuits consisted of the two SPDs. In the second SPD group 40, cathode electrodes of respective SPDs are connected to the inverting input terminal of the RF amplifier 10 and anode electrodes of respective SPDs are connected to the ground.

A reference voltage 50 $V_{ref1}$ is connected to the non-inverting input terminal of the RF amplifier 10 as well as that of the focus amplifier 20. The feedback resistors r21~r24 in the focus amplifier 20 are connected between the respective output terminals 26~29 and the inverting input terminals of the respective operational amplifiers 21~24. The output terminal 16 of the operational amplifier 11 of the RF amplifier 10 is connected to the inverting input terminal of the operational amplifier 11 via the feedback resistor r11. The output $RF_{OUT}$ from the RF amplifier 10 is connected to an analog/digital converter in the next stage which is not illustrated in FIG. 3. The focus signals $A_{OUT} \sim D_{OUT}$ from the focus amplifier 20 are connected to a focus control circuit in the next stage.

Figure 7:
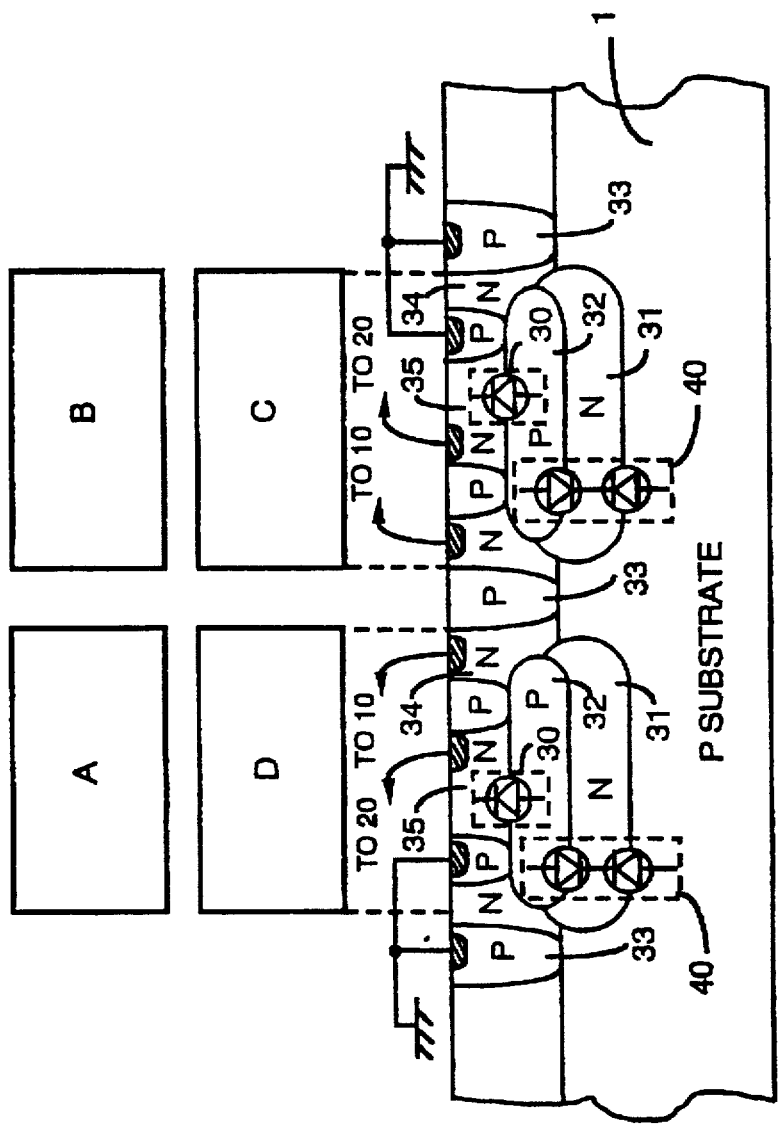
FIG. 7 is a structural diagram showing an IC of the SPD according to the third embodiment of the invention.

FIG. 7 is a cross sectional view of the SPDs in the optical pick-up system according to the third embodiment of the invention. In this optical pick-up system, a second SPD group 40 consists of a parallel connection of two SPDs. One SPD is formed between the P type substrate 1 and a first N type region 31. The other SPD is formed between the respective first N type region 31 and the respective second P type region 32. The first SPD group 30 is formed between the second P type region 32 and second N type regions 35 on the second P type regions 32. The anodes of the SPDs in the first SPD group 30 correspond to the second P type region 32, and the cathodes of the SPDs in the first SPD group 30 correspond to the respective second N type region 35. The anodes of the two diodes forming the SPDs in the second SPD group 40 correspond to the P type substrate 1 and the second P type region 32, respectively and the cathodes of the SPDs in the second SPD group 40 correspond to the N type region 31. In FIG. 7, both the P type substrate and the second P type region 32 are grounded via an isolation region and the N type region 31 on the P type substrate is connected in common to the inverted input terminal of the operational amplifier 11 in the RF amplifier 10. Respective second N type layer 35 at the top portion is connected to the inverting input terminal of the respective operational amplifiers 21~24 in the focus amplifier 20. In this third embodiment, two SPDs in the respective second SPD group 40 are formed in parallel and their current direction becomes the same. Therefore, the currents from respective SPDs flow in the same direction and are added to each other. Since the same current is taken out from the respective SPDs, this improves the efficiency of detecting photo-electric current.

An operation of the third embodiment is explained below. Similarly to the prior art, the four SPDs (A~D) receive laser reflection light 130 and generate photo-electric current. The currents generated in the respective SPDs in the first SPD group 30 flow through the respective resistors r21~r24 in the focus amplifier 20 in the direction from the respective output terminals to the respective cathode electrodes. Therefore, the voltage of focus signal $A_{OUT} \sim D_{OUT}$ at the output terminal 26~29 of the operational amplifiers 21~24 in the focus amplifier 20 is higher than $V_{ref2}$ by the voltage drop due to the respective resistors r21~r24. Using this focus signals $A_{OUT} \sim D_{OUT}$, focal point of the laser reflection light is adjusted. The currents generated in the respective SPDs in the second SPD group 40 are added together and flow from the output terminal to the respective cathode electrodes through the feedback resistor r11 in the RF amplifier 10. Therefore, the voltage of an information signal $RF_{OUT}$ at the output terminal 16 of the operational amplifier 11 in the RF amplifier 10 is higher than $V_{ref1}$ by the voltage due to the voltage drop in the feedback resistor r11. The detection of the information signal is carried out by this information signal $RF_{OUT}$.

As mentioned above, the feature of the invention, similar to that of the first embodiment, lies in that the photo-electric currents generated in the respective SPDs in the second SPD group 40 are directly added for detecting the information signal, while adjusting the focal point of laser reflection light is carried out in the first SPD group 30. Accordingly, even if the laser reflection light 130 is feeble, the detection of information signal is possible. Furthermore, unlike the prior art, since the signal which is passed through the focus amplifier 20 is not used for the detection of information signal, the noise which is generated in the focus amplifier 20 is not added to the data detection signal. Accordingly, an information signal with less error can be detected.

EMBODIMENT 4

Figure 4:
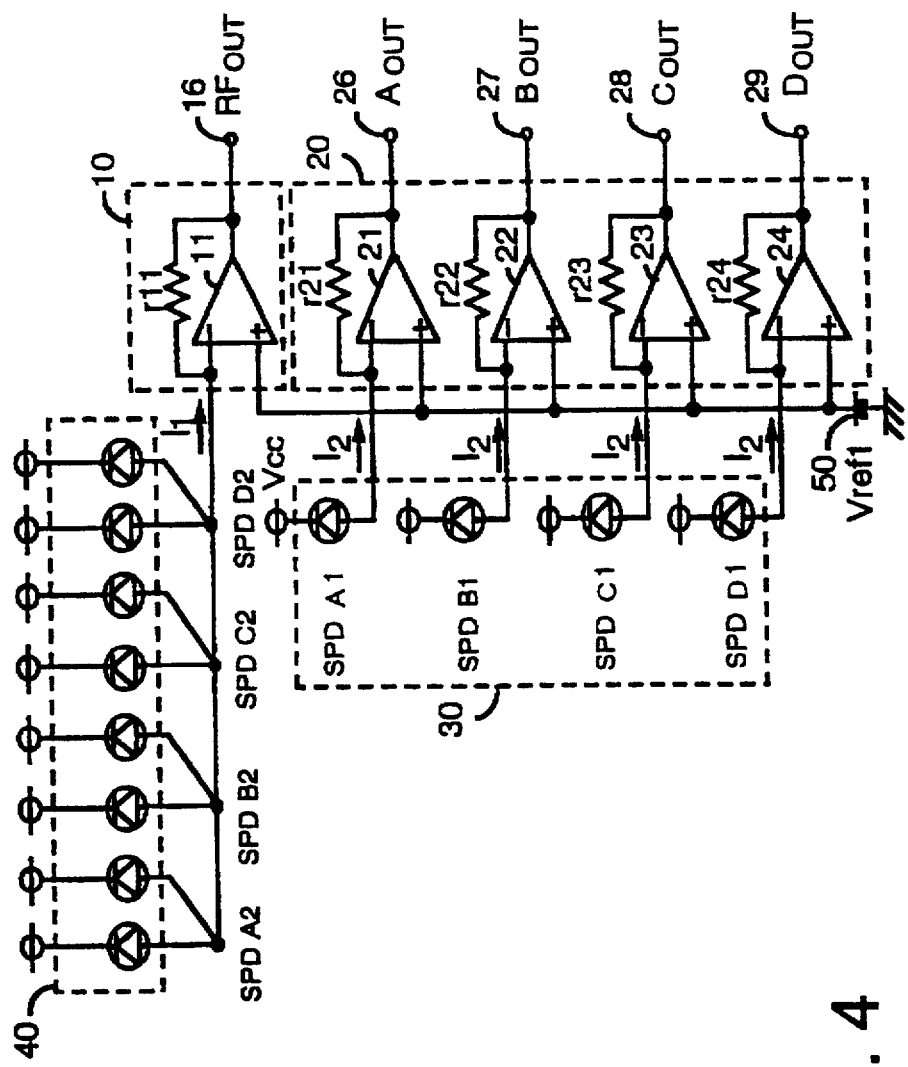
FIG. 4 is a block diagram showing an SPD in an optical pick-up system according to a fourth embodiment of the invention.

FIG. 4 is a block diagram showing an optical pick-up system according to a fourth embodiment of the invention. In this system of the fourth embodiment, the P type substrate of the third embodiment is replaced by the N type substrate. Also, as similar to the third embodiment, this system refers to an optical pick-up system in which photo-electric currents generated in the respective separated SPDs are supplied to the respective inverting input terminals of the RF amplifier 10 as well as the focus amplifier 20.

The optical pick-up system in FIG. 4 comprises an RF amplifier 10, a focus amplifier 20 and a first SPD group 30 which comprises an SPD•A1, an SPD•B1, an SPD•C1 and an SPD•D1. In the first SPD group 30, respective anode electrodes are connected to respective inverting input terminals of the focus amplifier 20, and respective cathode electrodes are connected to respective power supply source. A second SPD group 40 consists of an SPD•A2, an SPD•B2, an SPD•C2 and an SPD•D2. Respective SPDs, namely the SPD•A2, the SPD•B2, the SPD•C2 and the SPD•D2, consist of respective parallel circuits consisted of the two SPDs.

In the second SPD group 40, anode electrodes of respective SPDs are connected to the inverting input terminal of the RF amplifier 10, and respective cathode electrodes are connected to respective power supply source. A reference voltage 50 $V_{refl}$ is connected to the non-inverting input terminals of the RF amplifier 10 as well as that of the focus amplifier 20. The feedback resistors r21~r24 in the focus amplifier 20 are connected between the respective operational amplifiers 26~29 and the inverting input terminal of the respective operational amplifiers 21~24. The output terminal 16 of the operational amplifier 11 of the RF amplifier 10 is connected to the inverting input terminal of the operational amplifier 11 via the feedback resistor r11. The output $RF_{OUT}$ from the RF amplifier 10 is connected to an analog/digital converter in the next stage which is not illustrated in FIG. 4. THE focus signals $A_{OUT}$-$D_{OUT}$ from the focus amplifier 20 are connected to a focus control circuit in the next stage.

Figure 8:
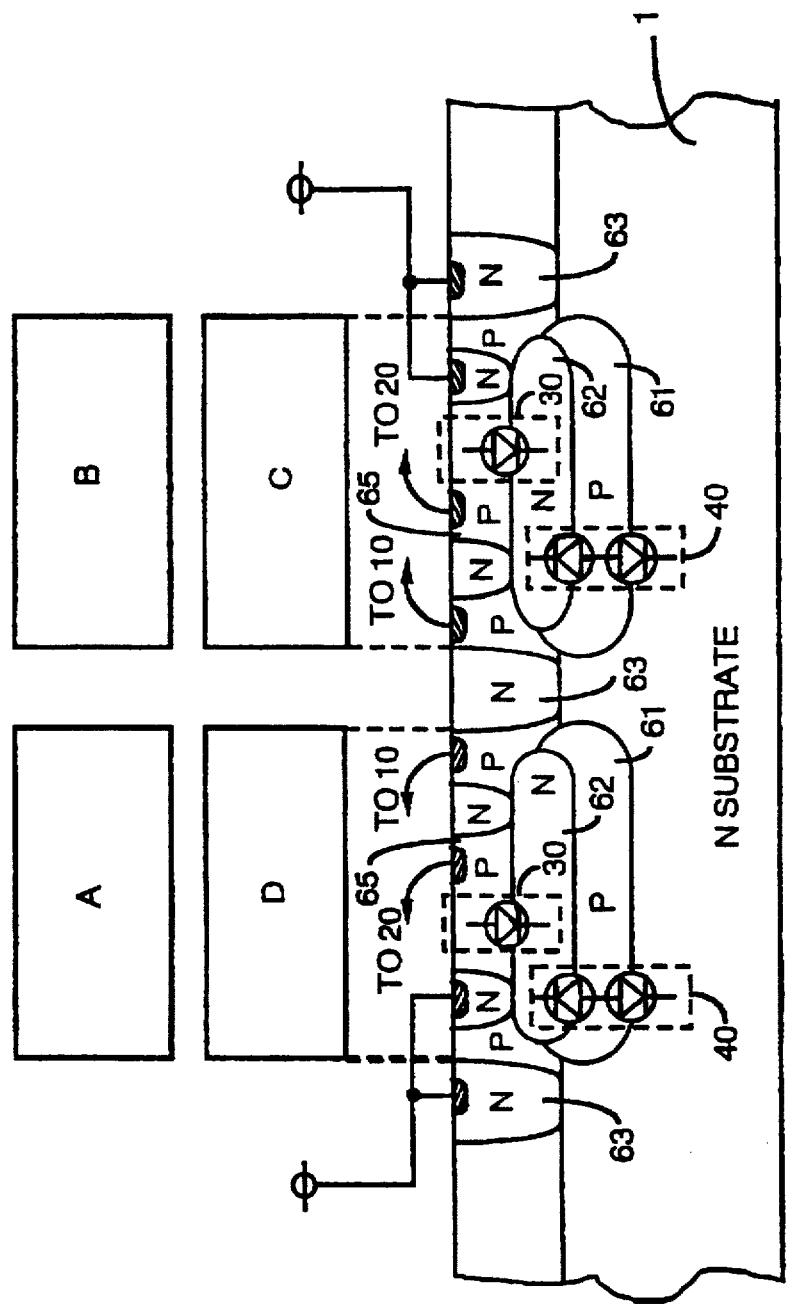
FIG. 8 is a structural diagram showing an IC of the SPD according to the fourth embodiment of the invention.

FIG. 8 shows a plain view as well as a gross sectional view of the SPDs in the optical pick-up system according to the fourth embodiment of the invention. In this optical pick-up system, second SPD group 40 consist of a parallel connection of two SPDs. One SPD is formed between the N type substrate 1 and a first P type region 61 which is separated from the others by an isolation region defined on the N type substrate. The other SPD is formed between the first P type region 61 and a second N type region 62 defined thereon. The first SPD group 30 is formed between the second N type region 62 and a second P type region 65 defined on the second N type region 62. The anodes of the SPD s in the first SPD group 30 correspond to the second P type region 65, and the cathodes of the SPDs in the first SPD group 30 correspond to the second N type region 62. The anodes of the two diodes forming the SPDs in the second SPD group 40 correspond to the first P type region 61, and the cathodes of the SPDs in the second SPD group 40 correspond to the P type substrate 1, and the second N type region 62, respectively.

In FIG. 8, both the N type substrate and the second N type region 62 are connected to the respective power supply source, and the P type region 61 on the N type substrate is connected in common to the inverting input terminal of the operational amplifier 11 in the RF amplifier 10. Respective second P type layers 65 at the top portion are connected to the inverted input terminals of the respective operational amplifiers 21~24 in the focus amplifier 20. In this fourth embodiment, two SPDs comprised in the respective second SPD group 40 are formed in parallel and their current direction becomes the same. Therefore, the currents from respective SPDs flow in the same direction and are added to each other. Since the same current is taken out from the respective SPDs, this improves the efficiency of detection photo-electric current.

An operation of the fourth embodiment is explained below. Similarly to the prior art, the four SPDs (A~D) receive laser reflection light 130 and generate photo-electric current. The currents generated in the respective SPDs in the first SPD group 30 flow through the respective resistors r21~r24 in the focus amplifier 20 in the direction from the respective cathode electrodes to the respective output terminals. Therefore, the voltage of focus signals $A_{OUT}$-$D_{OUT}$ at the output terminals 26~29 of the respective operational amplifiers 21~24 in the focus amplifier 20 is lower than $V_{refl}$ by the voltage drop due to the respective resistors r21~r24. Using this focus signals $A_{OUT}$-$D_{OUT}$ focal point of the laser reflection light is adjusted.

The currents generated in the respective SPDs in the second SPD group 40 are added together and flow from the respective cathode electrodes to the output terminal through the feedback resistor r11 in the RF amplifier 10. Therefore, the voltage of an information signal $RF_{OUT}$ at the output terminal 16 of the operational amplifier 11 in the RF amplifier 10 is lower than $V_{refl}$ by the voltage due to the voltage drop in the feedback resistor r11. The detection of the information signal is carried out by this information signal $RF_{OUT}$.

As mentioned above, the feature of the invention, similar to that of the third embodiment, lies in that the respective photo-electric currents generated in the SPDs in the second SPD group 40 are directly added for detecting information signal, while adjusting the focal point of laser reflection light is carried out in the first SPD group 30. Accordingly, even if the laser reflection light 130 is feeble, the detection of information signal is possible. Furthermore, unlike the prior art, since the signal which is passed through the focus amplifier 20 is not used for the detection of information signal, the noise which is generated in the focus amplifier 20 is not added to the data detection signal. Accordingly, an information signal with less error can be detected.

EMBODIMENT 5

Figure 9:
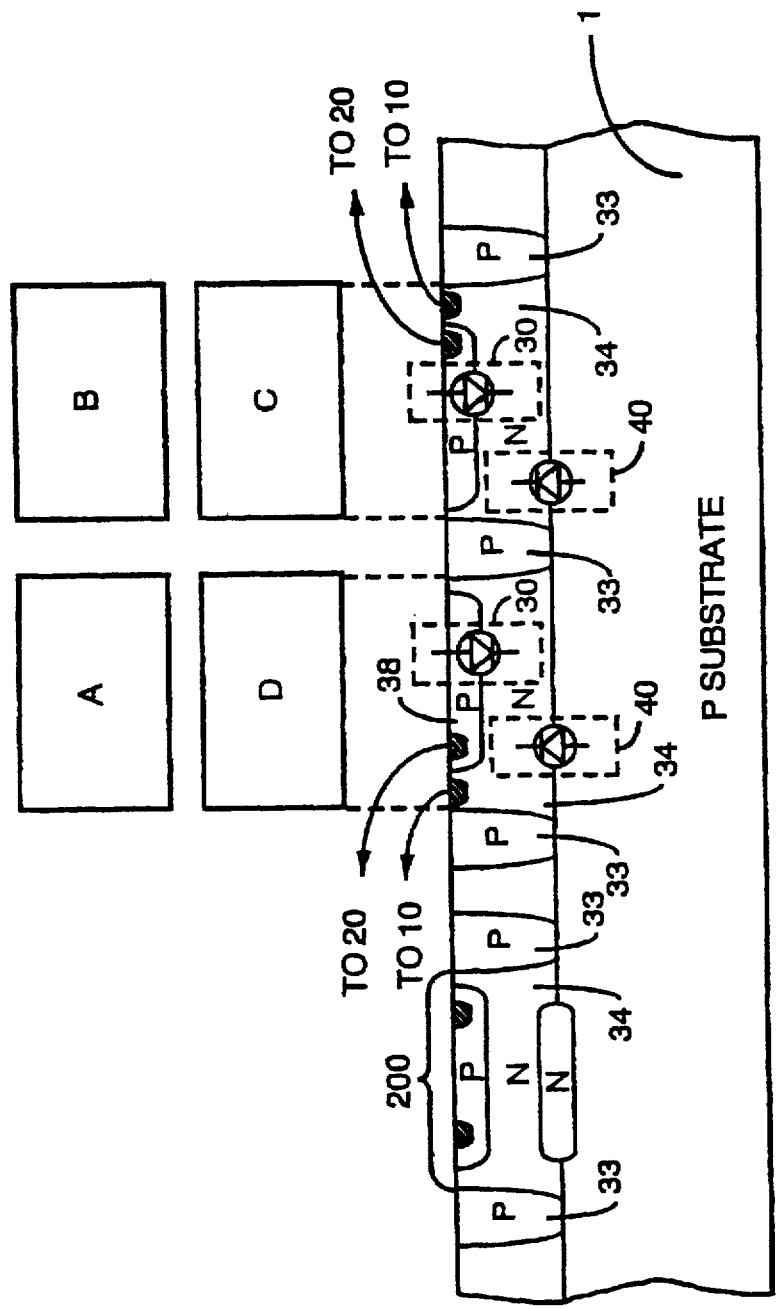
FIG. 9 is a structural diagram showing an IC of the SPD according to the fifth embodiment of the invention.

FIG. 9 is a structural diagram showing an integrated circuit comprising SPDs according to a fifth embodiment of the invention. As for an optical pick-up system of the invention, the SPDs are formed on the integrated circuit together with resistors r11, r21~r24 which are also formed on the same IC substrate, because these resistors are used together with the SPDs. In FIG. 9, the resistor portion is shown with the reference number 200. These resistor portion can be formed in the same processes as those for forming the SPD (A, B, C, D) portions.

In other words, in the formation process of a first and a second SPD groups, a first N type region for the resistor potion is formed simultaneously with the process in which respective first N type regions for the SPD regions are formed on the P type substrate and a second P type region for the resistor portion is formed simultaneously with the process in which respective second P type region for the SPD regions are formed so that the SPD regions and the resistor portion can be formed side by side. The anodes of the SPDs in the first SPD group 30 correspond to the respective P type regions 38 and the cathodes of the SPDs in the first SPD group 30 correspond to the respective N type regions 34. The anodes of the diodes which constitute the SPDs in the second SPD group 40 correspond to the P type substrate 1 and the cathodes of the SPDs in the second SPD group 40 correspond to the N type region 34. The silicon photo diodes structure as mentioned above facilitates the manufacturing processes of an optical pick-up system. The structure described above is applicable to a silicon photo diode structure formed on an N type substrate, instead of those formed on a P type substrate as mentioned above. In that case, the "P type" in the above description is replaced by the "N type".

EMBODIMENT 6

Figure 10:
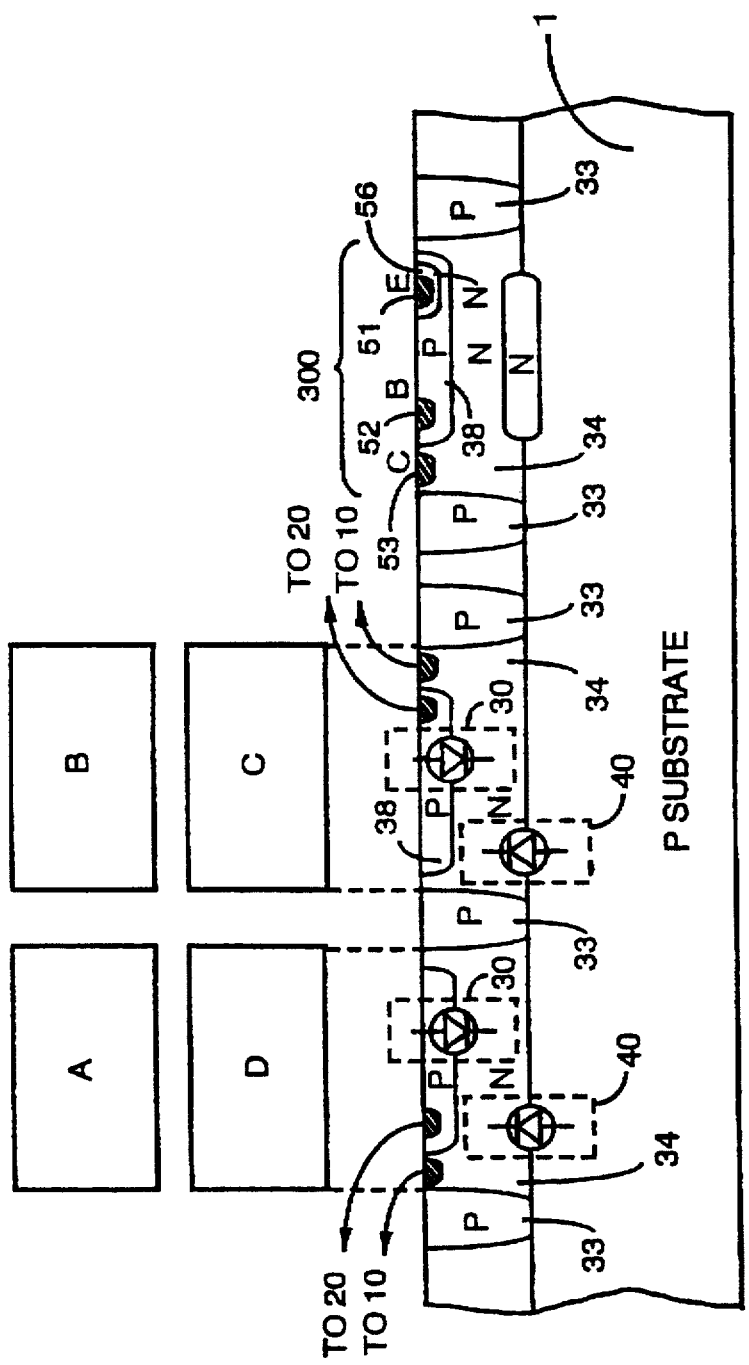
FIG. 10 is a structural diagram showing an IC of the SPD according to the sixth embodiment of the invention.

FIG. 10 is a structural diagram showing an integrated circuit of SPDs according to a sixth embodiment of the invention. As for an optical pick-up system of the invention, the SPDs are formed on an integrated circuit, and an RF amplifier 10 and a focus amplifier 20 must be formed on the same IC substrate, because these operational amplifiers are used together with the SPDs. In FIG. 10, the transistor portion is shown by the reference number 300. These transistor portion can be formed in the same processes as those for forming the SPD (A,B, C, D) portions. In other words, in the formation process of a first and a second SPD groups, a first N type region for the transistor portion is formed simultaneously with the process in which a first N type region for the SPD region is formed on the P type substrate, a second P type region for the transistor portion is formed simultaneously with the process in which a second P type region for the SPD region is formed, and a second N type region necessary only to the transistor portion is added so that the SPD region and the transistor portion can be formed side by side. The anodes of the SPDs in the first SPD group 30 correspond to the P type region 38 and the cathodes of the first SPD 30 correspond to the N type region 34. The anodes of the diodes which constitute the SPDs in the second SPD group 40 correspond to the P type substrate 1, and the cathodes of the SPDs in the second SPD group 40 correspond to the N type region 34.

At this stage, a transistor is formed, whose collector electrode 53 is formed in the first N type region 34, whose base electrode 52 is formed in the second P type region 38, and whose emitter electrode 51 is formed in the second N type region 56. The silicon photo diode structure as mentioned above facilitates the manufacturing processes of an optical pick-up system. The structure described above is applicable to a silicon photo diode structure formed on an N type substrate, instead of those formed on a P type substrate as mentioned above. In that case, the "P type" in the above description is replaced by the "N type".

EMBODIMENT 7

Figure 11:
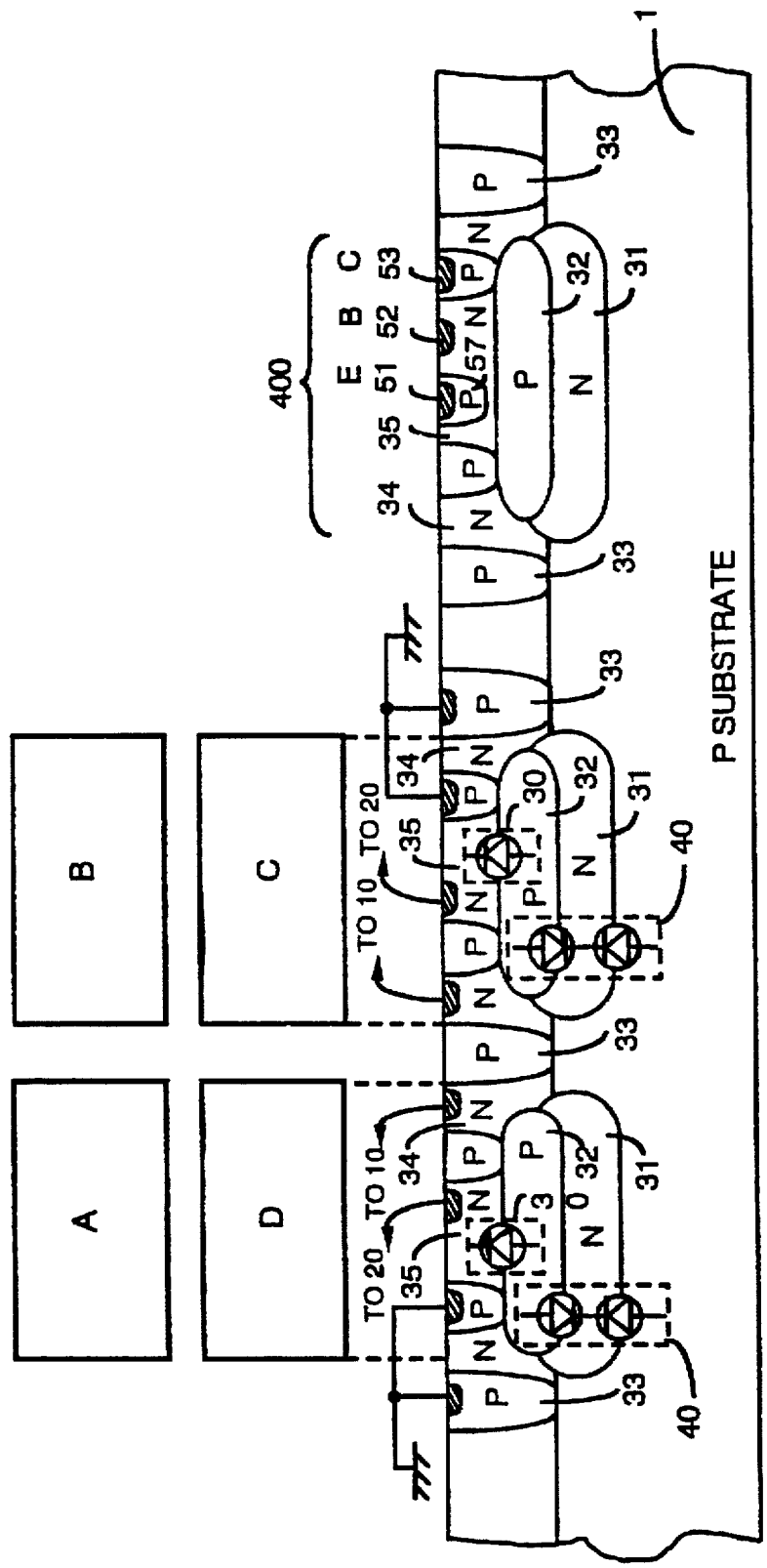
FIG. 11 is a structural diagram showing an IC of the SPD according to the seventh embodiment of the invention.

FIG. 11 is a cross sectional view of an SPD of an optical pick-up system according to a seventh embodiment of the invention. In this optical pick-up system, the RF amplifier 10 and the focus amplifier 20 are used together with the SPD. Therefore, it is appropriate to form these amplifier together with the SPD on the IC substrate. In FIG. 11, C-PNP transistor porion 400 is formed in parallel with the SPD on the IC substrate. The transistor portion can be formed on the IC substrate in the similar processes to that of the SPD (A, B, C, D) portions. That is, in a similar manner to the sixth embodiment, by adding the P type second region necessary only to the transistor portion can be formed side by side. In the above SPD, the anodes of the SPDs in the first SPD group 30 correspond to the P type region 32, the cathodes of the first SPD 30 correspond to the N type region 35. The anodes of the diodes which constitute the SPDs in the second SPD group 40 correspond to the P type substrate 1 and the P type region 32 and the cathodes of the SPDs in the second SPD group 40 correspond to the N type region 31.

The above mentioned C-PNP transistors are formed on the P substrate 1, whose collector terminals 53 are drawn from the second P type regions 32, whose base terminals 32 are formed in the second N type regions 35, and whose emitter terminals 51 are formed in the third P type regions 57. The silicon photo diode structure as mentioned above facilitates the manufacturing processes of an optical pick-up system. The structure described above is applicable to a silicon photo diode structure formed on an N type substrate, instead of those formed on a P type substrate as mentioned above. In that case, the "P type" in the above description is replaced by the "N type".

As mentioned above, the feature of the invention of the seventh embodiment, similar to that of the third embodiment, lies in that the two SPDs in the second SPD group 40 are connected in parallel and the both currents generated in the respective two SPDs are added to take out the twice of current, which improves the detection efficiently of photo-electric current.

What is claimed is:

1. A signal processing device for optical pick-up comprising:
   an information signal silicon photo diode group comprising a plurality of silicon photo diodes, a first electrode of each of said plurality of silicon photo diodes being directly connected to a common connection node, and a second electrode of each of said silicon photo diodes being connected to a predetermined potential node being supplied with a predetermined electrical potential, wherein each of said plurality of silicon photo diodes is connected in parallel between said predetermined potential node and said common connection node; and
   an information signal amplifier including an input node directly connected to said common connection node and an output node for outputting an information signal.

2. A signal processing device for optical pick-up comprising:
   an information signal silicon photo diode group comprising a plurality of silicon photo diodes, a first electrode of each of said plurality of silicon photo diodes being directly connected to a common connection node, and a second electrode of each of said plurality of silicon photo diodes being connected to a predetermined potential node being supplied with a predetermined electrical potential;
   an information signal amplifier including an input node directly connected to said common connection node and an output node for outputting an information signal;
   a focus signal silicon photo diode group comprising a plurality of silicon photo diodes, each silicon photo diode of said focus signal silicon photo diode group having first and second electrodes, said first electrode of each silicon photo diode of said focus signal diode group being connected to said common connection node; and
   a focus signal amplifier comprising an output node for outputting a focus signal and a plurality of input nodes respectively corresponding to respective silicon photo diodes of said focus signal silicon photo diode group, each of said plurality of input nodes connected to a second electrode of a corresponding silicon photo diode of said focus signal silicon photo diode group.

3. A signal processing device for optical pick-up comprising:
   an information signal silicon photo diode group comprising a plurality of silicon photo diodes, a first electrode of each of said plurality of silicon photo diodes being directly connected to a common connection node, and a second electrode of each of said plurality of silicon photo diodes being connected to a predetermined potential node being supplied with a predetermined electrical potential;
   an information signal amplifier including an input node directly connected to said common connection node and an output node for outputting an information signal;
   a focus signal silicon photo diode group comprising a plurality of silicon photo diodes, each silicon photo diode of said focus signal silicon photo diode group having first and second electrodes, said first electrode of each silicon photo diode of said focus signal silicon photo diode group being connected to a predetermined potential node being supplied with a predetermined electrical potential; and a focus signal amplifier comprising an output node for outputting a focus signal and a plurality of input nodes respectively corresponding to respective silicon photo diodes of said focus signal silicon photo diode group, each of said plurality of input nodes connected to a second electrode of a corresponding silicon photo diode of said focus signal silicon photo diode group.

4. A signal processing device for optical pick-up comprising:

an information signal silicon photo diode group comprising a plurality of silicon photo diodes, each of said plurality of silicon photo diodes having a plurality of silicon photo diodes which are connected in parallel between a predetermined potential node supplied with a predetermined electrical potential and a common connection node, a first electrode of each of said plurality of silicon photo diodes being directly connected to said common connection node, and a second electrode of each of said silicon photo diodes being connected to said predetermined potential node; and an information signal amplifier including an input node directly connected to said common connection node and an output node for outputting an information signal.

5. A signal processing device for optical pick-up comprising:

an information signal silicon photo diode group comprising a plurality of silicon photo diodes, each silicon photo diode having first and second electrodes, said first electrode of each of said plurality of silicon photo diodes being connected to a common connection node;

an information signal amplifier comprising:
an input node connected to the common connection node;
an output node for outputting an information signal;
an operational amplifier having an inverting input terminal connected to said input node of said information signal amplifier, a non-inverting input terminal receiving a first reference electrical potential, an output terminal connected to said output node of said information signal amplifier; and
a resistor element connected between said inverting input terminal and said output terminal of said operational amplifier;

a focus signal silicon photo diode group comprising a plurality of silicon photo diodes, each silicon photo diode of said focus signal silicon photo diode group having first and second electrodes, said first electrodes of said plurality of silicon photo diodes of said focus signal silicon photo diode group being connected to said input node of said information signal amplifier; and a focus signal amplifier comprising:
a plurality of input nodes corresponding to respective silicon photo diodes of said focus signal silicon photo diode group, each input node being connected to said second electrode of a corresponding silicon photo diode of said focus signal silicon photo diode group;
a plurality of operational amplifiers corresponding to respective input nodes of said focus signal amplifier, each operational amplifier including an inverting input terminal connected to a corresponding input node of said focus signal amplifier, a non-inverting input terminal receiving a second reference electrical potential, and an output terminal;
a plurality of resistor elements, each resistor element being connected between said non-inverting input terminal and said output terminal of a corresponding operational amplifier of said focus signal amplifier; and
a plurality of output nodes, each output node being coupled to said output terminal of a corresponding operational amplifier of said focus amplifier for outputting a plurality of focus signals.

6. The signal processing device for optical pick-up according to claim 5, wherein:

each first electrode of said plurality of silicon photo diodes of said information signal silicon photo diode group is a cathode electrode and each second electrode of said plurality of silicon photo diodes of said information signal silicon photo diode group is an anode electrode;

each first electrode of said plurality of silicon photo diodes of said focus signal silicon photo diode group is a cathode electrode and each second electrode of said plurality of silicon photo diodes of said focus signal silicon photo diode group is an anode electrode;

said second electrodes of said plurality of silicon photo diodes of said information signal silicon photo diode group are connected to a ground potential node supplied with a ground potential; and said first reference electrical potential is higher than said second reference electrical potential.

7. The signal processing device for optical pick-up according to claim 5, wherein:

each first electrode of said plurality of silicon photo diodes of said information signal silicon photo diode group is an anode electrode and each second electrode of said plurality of silicon photo diodes of said information signal silicon photo diode group is a cathode electrode;

each first electrode of said plurality of silicon photo diodes of said focus signal silicon photo diode group is an anode electrode and each second electrode of said plurality of silicon photo diodes of said focus signal silicon photo diode group is a cathode electrode;

said second electrodes of said plurality of silicon photo diodes of said information signal silicon photo diode group are connected to a power supply node supplied with a power supply potential; and said first reference electrical potential is lower than said second reference electrical potential.

8. A semiconductor device for an optical pick-up comprising:

an information signal silicon photo diode group comprising four silicon photo diodes, each silicon photo diode having first and second electrodes, said first electrode of each of said plurality of silicon photo diodes being connected to a common connection node connected to an input node of an information signal amplifier, and said second electrode of each of said silicon photo diodes being connected to a predetermined potential node supplied with a predetermined electrical potential;

a focus signal silicon photo diode group comprising four silicon photo diodes, each silicon photo diode of said focus signal silicon photo diode group having first and second electrodes, said first electrodes of said four silicon photo diodes of said focus signal silicon photo diode group being connected to said common connection node connected to said input node of said information signal amplifier, and said second electrode of each of said plurality of silicon photo diodes of said focus signal silicon photo diode group being connected to a corresponding input node of a focus signal amplifier; and a semiconductor body comprising:

a semiconductor substrate of a first conductivity type;

an epitaxial layer of a second conductivity type, opposite the first conductivity type, formed on a surface of said semiconductor substrate, wherein a junction between said semiconductor substrate and said epitaxial layer is a PN junction;

four silicon photo diode formation regions mutually separated by a separation region of the first conductivity type extending through the epitaxial layer to the surface of the semiconductor substrate, each of said four silicon photo diodes of said information signal silicon photo diode group and each of said four silicon photo diodes of said focus signal silicon photo diode group being formed on a corresponding one of said four silicon photo diode formation regions; and four first semiconductor regions of the first conductivity type, each of said four first semiconductor regions being formed on a surface of said epitaxial layer surrounded by said separation region in a corresponding silicon photo diode formation region, and forming a second electrode region for said second electrode of a corresponding silicon photo diode of said focus signal silicon photo diode group, wherein said semiconductor substrate for each of said four silicon photo diode formation regions becomes a second electrode region as said second electrode of a corresponding silicon photo diode of said information signal silicon photo diode group, said epitaxial layer for each of said four silicon photo diode formation regions becomes a first electrode region as said first electrode of a corresponding silicon photo diode of said information signal silicon photo diode group, and a first electrode region as said first electrode of a corresponding silicon photo diode of said focus signal silicon photo diode group.

9. The semiconductor device for an optical pick-up according to claim 8, wherein an information signal amplifier and a focus signal amplifier are formed on the surface of said semiconductor body;

at least one resistor element constituting said information signal amplifier or said focus signal amplifier are formed on a surface of a second semiconductor region formed on the surface of said epitaxial layer surrounded by a separation region of the first conductivity type extending through said epitaxial layer to the surface of said semiconductor substrate; and wherein a depth of diffusion and concentration of impurity of said four first semiconductor regions are the same as those of said second semiconductor region.

10. The signal processing device for an optical pick-up according to claim 8, wherein an information signal amplifier and a focus signal amplifier are formed on the surface of said semiconductor body;

at least one transistor element constituting an information signal amplifier or a focus signal amplifier comprises a collector region in said epitaxial layer surrounded by a separation region of the first conductivity type extending through said epitaxial layer to the surface of said semiconductor substrate, a base region in a second semiconductor region of the first conductivity type formed on the surface of said collector region, and an emitter region in a third semiconductor region of the second conductivity type formed on the surface of said base region; and wherein a depth of diffusion and concentration of impurity of said four first semiconductor regions are the same as those of said second semiconductor region.

11. A semiconductor device for an optical pick-up comprising:

an information signal silicon photo diode group comprising four silicon photo diode pairs, each of said four silicon photo diode pairs including first and second silicon photo diodes connected in parallel, each of said four silicon photo diode pairs having first and second electrode electrodes, said first electrodes being connected to a common connection node connected to an input node of an information signal amplifier, and said second electrode of each of said four silicon photo diode pairs being connected to a predetermined potential node supplied with a predetermined electrical potential;

a focus signal silicon photo diode group comprising four silicon photo diodes, each silicon photo diode of said focus signal silicon photo diode group having first and second electrodes, said first electrode of each of said four silicon photo diodes being connected to a corresponding input node of a focus signal amplifier, and said second electrodes being connected to a predetermined potential node supplied with a predetermined electrical potential; and a semiconductor body comprising:

a semiconductor substrate of a first conductivity type;

an epitaxial layer of a second conductivity type, opposite the first conductivity type, formed on the surface of said semiconductor substrate, wherein a junction between said semiconductor substrate and said epitaxial is a PN junction;

four silicon photo diode formation regions mutually separated by a separation region of the first conductivity type extending through said epitaxial layer to the surface of said semiconductor substrate, each of said four silicon photo diode pairs of said information signal silicon photo diode group and each of said four silicon photo diodes of said focus signal silicon photo diode group being formed on a corresponding one of said four silicon photo diode formation regions, wherein:

said semiconductor substrate for each of said four silicon photo diode formation regions becomes a second electrode region as said second electrode of the first silicon photo diode of a corresponding silicon photo diode pair of said information signal silicon photo diode group;

four first embedded regions of the second conductivity type, each of said four first embedded regions being embedded at a PN junction surrounded by said separation region between said semiconductor substrate and said epitaxial layer for a corresponding silicon photo diode formation region of said four silicon photo diode formation regions, and becoming a first electrode region as said first electrodes of said first and second silicon photo diodes of a corresponding silicon photo diode pair of said information signal silicon photo diode group;

four second embedded regions of the first conductivity type, each of said four second embedded regions being formed on a surface of a corresponding first embedded region of said four first embedded regions, and becoming a second electrode region as said second electrode of said second silicon photo diode of a corresponding silicon photo diode pair of said information signal silicon photo diode group and said second electrode of a corresponding silicon photo diode of said focus signal silicon photo diode group; and four lead regions of the first conductivity type, each of said four lead regions extending from the surface of said epitaxial layer into a corresponding silicon photo diode formation region surrounded by said separation region to the surface of a corresponding second embedded region, for electrically dividing said epitaxial layer into a corresponding silicon photo diode formation region into an inside epitaxial layer and an outside epitaxial layer, wherein:

each of said four lead regions becoming an electrode drawing region for a corresponding second embedded region, said outside epitaxial layer of each of said four silicon photo diode formation regions becoming an electrode drawing region for a corresponding first embedded region, and said inside epitaxial layer of each of said four silicon photo diode formation regions becomes a first electrode region as said first electrode of a corresponding silicon photo diode of said focus signal silicon photo diode group.

12. The semiconductor device for an optical pick-up according to claim 11, wherein an information signal amplifier and a focus signal amplifier are formed on the surface of said semiconductor body;

at least one transistor element constituting said information signal amplifier or said focus signal amplifier comprises a collector region in a fourth embedded region of the first conductivity type formed on a third embedded region of the second conductivity type which is embedded at a PN junction between said semiconductor substrate and said epitaxial layer surrounded by a separation region of the first conductivity type extending through said epitaxial layer to the surface of said semiconductor substrate, a base region in the epitaxial layer forming a PN junction with said collector region, and an emitter region in a semiconductor region of the first conductivity type formed on the surface of said base region;

impurity material and concentration of impurity of said four first semiconductor regions are the same as those of said third semiconductor region, and impurity material and concentration of impurity of said four second semiconductor regions are the same as those of said fourth semiconductor region.

* * * * *

UNITED STATES PATENT AND TRADEMARK OFFICE
CERTIFICATE OF CORRECTION

PATENT NO.   :   5,796,689
DATED        :   August 18, 1998
INVENTOR(S) :   Houmoto et al.

It is certified that error appears in the above-identified patent and that said Letters Patent is hereby corrected as shown below:

Column 18, Line 17, delete "electrode";

Line 39, before "is" insert --layer--;

Column 19, Line 19, change "becoming" to --becomes--;

Line 23, change "becoming" to --becomes--.

Signed and Sealed this

Nineteenth Day of January, 1999

Attest:

*Acting Commissioner of Patents and Trademarks*

*Attesting Officer*